US012765291B2

(12) United States Patent
Lee et al.

(10) Patent No.: US 12,765,291 B2
(45) Date of Patent: Oct. 13, 2026

(54) CO-DEPOSITION AND ETCH PROCESS

(71) Applicant: Lam Research Corporation, Fremont, CA (US)

(72) Inventors: Younghee Lee, Pleasanton, CA (US); Michelle Margarita Flores Espinosa, Union City, CA (US); Wenbing Yang, Campbell, CA (US); Samantha SiamHwa Tan, Newark, CA (US); Arunima Deya Balan, Mountain View, CA (US); Yiwen Fan, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/856,817

(22) PCT Filed: Mar. 14, 2023

(86) PCT No.: PCT/US2023/015209

§ 371 (c)(1),
(2) Date: Oct. 14, 2024

(87) PCT Pub. No.: WO2023/215040

PCT Pub. Date: Nov. 9, 2023

(65) Prior Publication Data

US 2025/0243585 A1 Jul. 31, 2025

Related U.S. Application Data

(60) Provisional application No. 63/337,307, filed on May 2, 2022.

(51) Int. Cl.

*H10P 50/24* (2026.01)
*H10P 50/28* (2026.01)

(52) U.S. Cl.

CPC .......... *H10P 50/244* (2026.01); *H10P 50/285* (2026.01)

(58) Field of Classification Search

CPC ...................... H01L 21/3065; H01L 21/30655
See application file for complete search history.

(56) References Cited

U.S. PATENT DOCUMENTS 4,975,144 A * 12/1990 Yamazaki ......... H01L 21/31116 216/48
2010/0167549 A1* 7/2010 Ogasawara ....... H01L 21/30655 257/E21.252

(Continued)

FOREIGN PATENT DOCUMENTS

WO 2021/162871 8/2021
WO 2021/207286 10/2021

OTHER PUBLICATIONS

International Search Report and Written Opinion from International Application No. PCT/US2023/015209 dated Jul. 13, 2023.

*Primary Examiner* — Alex A Rolland
(74) *Attorney, Agent, or Firm* — Beyer Law Group LLP

(57) ABSTRACT

A method for selectively etching at least one feature in an etch layer of doped or undoped material of at least one of silicon, silicon germanium, carbon, and germanium with respect to a mask is provided. A simultaneously selectively etching at least one feature in the etch layer with respect to the mask and selectively depositing a deposition layer is provided by providing an etch gas comprising a metalloid or metal containing precursor and a halogen or oxygen containing component, forming the etch gas into a plasma. and exposing the etch layer to the plasma to simultaneously selectively etching at least one feature in the etch layer with respect to the mask and selectively depositing a deposition (Continued)

layer of metalloid or metal containing material over the mask with respect to the etch layer.

13 Claims, 6 Drawing Sheets

(56) References Cited

U.S. PATENT DOCUMENTS

| | | | | |
|---|---|---|---|---|
| 2015/0332932 | A1 | 11/2015 | Hirotsu et al. | |
| 2017/0069462 | A1* | 3/2017 | Kanarik | H01L 21/321 |
| 2018/0061659 | A1 | 3/2018 | Tan et al. | |
| 2018/0315616 | A1 | 11/2018 | Rastogi et al. | |
| 2019/0101838 | A1* | 4/2019 | Chen | G03F 7/7085 |

* cited by examiner

CO-DEPOSITION AND ETCH PROCESS

CROSS-REFERENCE TO RELATED APPLICATION

This application claims the benefit of priority of U.S. Application No. 63/337,307, filed May 2, 2022, which is incorporated herein by reference for all purposes.

BACKGROUND

The background description provided here is for the purpose of generally presenting the context of the disclosure. Information described in this background section, as well as aspects of the description that may not otherwise qualify as prior art at the time of filing, are neither expressly nor impliedly admitted as prior art against the present disclosure.

The disclosure relates to methods of forming semiconductor devices on a semiconductor wafer. More specifically, the disclosure relates to the selective etching of an etch layer with respect to a mask, such as a hardmask.

The smallest feature dimensions of semiconductor devices are constantly shrinking to follow Moore's law. In the formation of silicon fins and nanosheets, features with small widths and high aspect ratios are etched into silicon or carbon. Silicon oxide (SiO) or photoresist may be used as a mask. Improved etch selectivity allows for a thinner mask, resulting in improved resolution.

SUMMARY

To achieve the foregoing and in accordance with the purpose of the present disclosure, a method for selectively etching at least one feature in an etch layer of doped or undoped material of at least one of silicon, silicon germanium, carbon, and germanium with respect to a mask is provided. A simultaneously selectively etching at least one feature in the etch layer with respect to the mask and selectively depositing a deposition layer is provided by providing an etch gas comprising a metalloid or metal containing precursor and a halogen or oxygen containing component, forming the etch gas into a plasma, and exposing the etch layer to the plasma to simultaneously selectively etching at least one feature in the etch layer with respect to the mask and selectively depositing a deposition layer of metalloid or metal containing material over the mask with respect to the etch layer.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EXEMPLARY EMBODIMENTS

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

In the formation of semiconductor devices, silicon may be etched. Sometimes silicon or carbon may be etched in order to form silicon fins and silicon nanosheets and carbon features. Silicon nanosheets are two dimensional nanostructures of silicon with thicknesses in the range of 1 nanometer (nm) to 100 nm. For some front end of line processes, the addition of metal contaminants can change the semiconductor properties of silicon. As a result, for some front end of line processes the use of metal containing gases is avoided. In such processes, if a hardmask is used, the hardmask would not contain metal. In some silicon etching processes, such as a strained source drain (SSD) structure formation process, a hardmask of silicon nitride (SiN) or silicon oxide ($SiO_2$) may be used for etching silicon. In some pattern transfer processes, a photoresist (PR) may be used for etching amorphous carbon. To achieve a good etch selectivity, the metal containing PR may be used instead of the hydrocarbon polymer-based PR.

In this disclosure, a new process and apparatus are described. The process and apparatus enable the selective etching of an etch layer of doped or undoped silicon, silicon germanium, germanium, or carbon with respect to a mask. In various embodiments, the mask is a hardmask. In various embodiments, the mask is a photoresist (PR), such as a metal containing PR. The process is able simultaneously etch the etch layer while depositing a metalloid or metal containing layer over the mask.

Figure 1:
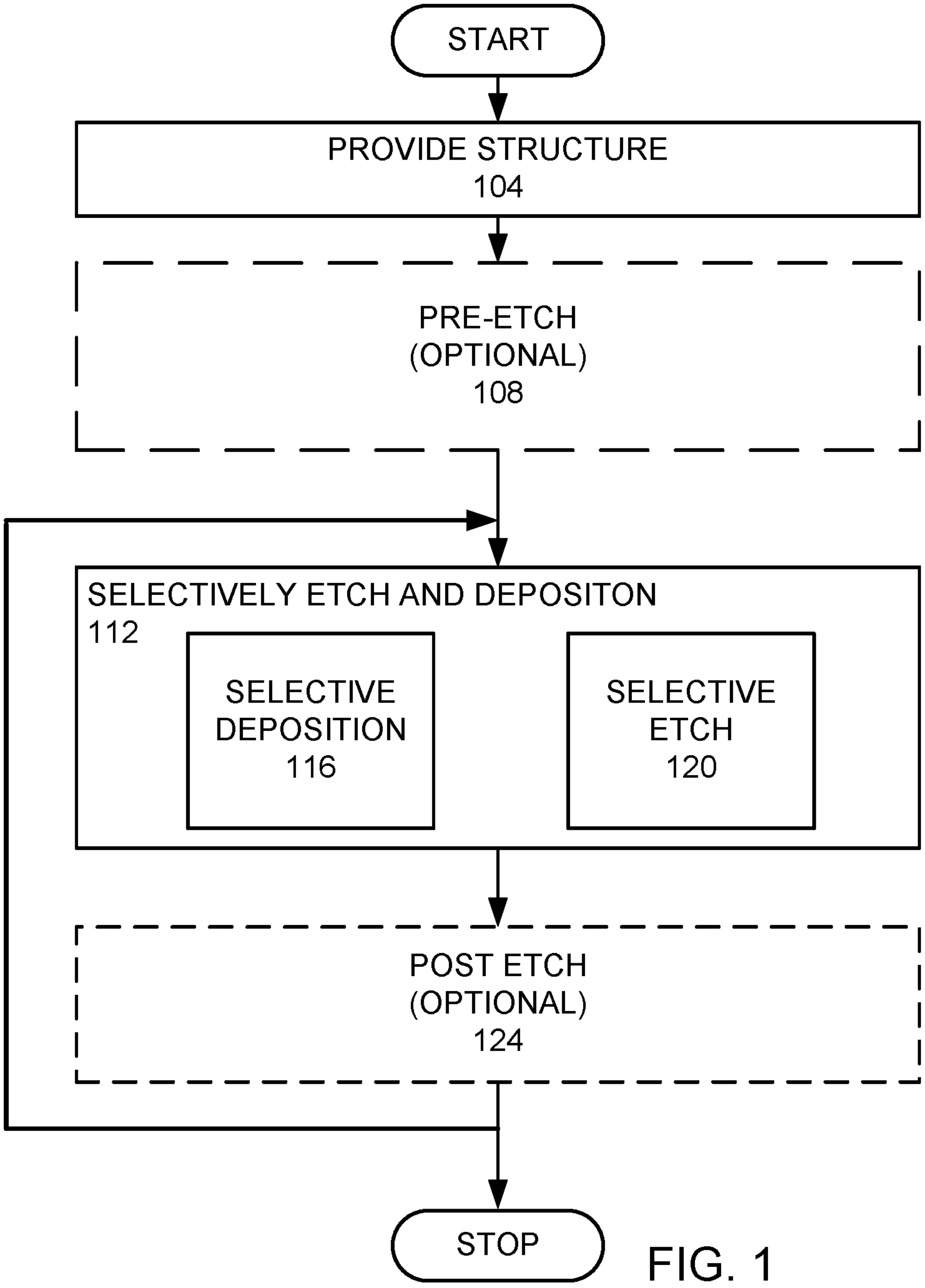
FIG. 1 is a high level flow chart of an embodiment.

In order to facilitate understanding, FIG. 1 is a high level flow chart of a process used in embodiments. A structure with an etch layer with a mask is provided (step 104). In some embodiments, the etch layer may be doped or undoped material of at least one of silicon, silicon germanium, and germanium. In other embodiments, the etch layer may be carbon, such as amorphous carbon. An optional pre-etch may also be provided (step 108) to partially selectively etch the etch layer with respect to the mask, such as a break-through process. Such a pre-etch may partially etch the mask.

A selective etch of the etch layer and selective deposition on the mask are provided (step 112). The selective etch of the etch layer and selective deposition on the mask (step 112) is a co-deposition and etch process. The selective etch of the etch layer and selective deposition on the mask comprises a selective deposition of a deposition layer on the mask process (step 116) and a selective etch of the etch layer process (step 120). In some embodiments, the selective deposition on the mask process (step 116) is performed by atomic layer deposition (ALD) or plasma enhanced atomic layer deposition (PEALD). In some embodiments, the selective deposition on the mask process (step 116) comprises providing a deposition component comprising a metalloid or metal containing precursor and forming the deposition component into a plasma during plasma enhanced chemical vapor deposition (PECVD). In some embodiments, the selective etch of the etch layer process (step 120) is performed by a reactive ion etch (RIE). In some embodiments, the selective etch of the etch layer process (step 120) is performed by atomic layer etching (ALE). In some embodiments, the selective etch of the etch layer process (step 120) comprises providing an etch component comprising a halogen containing component and forming the halogen containing component into a plasma during the RIE.

In various embodiments, the halogen containing component contains at least one of chlorine, bromine, iodine, and fluorine. In various embodiments, halogen containing components comprise at least one of hydrogen bromide (HBr), hydrogen fluoride (HF), hydrogen chloride (HCl), hydrogen iodide (HI), chlorine ($Cl_2$), boron trichloride ($BCl_3$), fluorocarbon, such as carbon tetrafluoride ($CF_4$), hexafluorobutadiene ($C+F_6$), and octafluorocyclobutane ($C_4F_8$), and fluorohydrocarbon, such as fluoromethane ($CH_3F$), difluoromethane ($CH_2F_2$), and fluoroform ($CHF_3$) to etch silicon, silicon germanium, and germanium. In other embodiments, an oxygen containing component comprising at least one of oxygen ($O_2$), ozone ($O_3$), carbon dioxide ($CO_2$), carbon monoxide (CO), carbonyl sulfide (COS), nitrogen dioxide ($NO_2$), nitrate ($NO_3$), and sulfur dioxide ($SO_2$) is provided to etch amorphous carbon. In various embodiments, the etching of carbon can be performed by a mixture of halogen containing components and oxygen containing components to etch carbon. For example, in some embodiments for etching an amorphous carbon layer, the etch gas may comprise $CH_2F_2$ and $O_2$, or may comprise methane ($CH_4$) and $O_2$, or may comprise HBr and $O_2$.

In some embodiments, the selective deposition on the mask process (step 116) and the selective etch of the etch layer process (step 120) are performed simultaneously. In some embodiments where the selective deposition on the mask process (step 116) and the selective etch of the etch layer process (step 120) are performed simultaneously, a selective deposition on the mask (step 116) is provided using at least one of PECVD, PEALD, and ALD simultaneously with a selective etch of the etch layer (step 120) using at least one of RIE and ALE. In some embodiments where the selective deposition on the mask process (step 116) and the selective etch of the etch layer process (step 120) are performed simultaneously, an etch gas comprising a deposition component comprising a metalloid or metal containing precursor is provided simultaneously with an etch component comprising a halogen containing component and/or an oxygen containing component. The etch gas is formed into a plasma. In some embodiments, both the deposition component and the etch component are simultaneously formed into a plasma. In other embodiments, the selective deposition on the mask process (step 116) and the selective etch of the etch layer process (step 120) are performed cyclically for a plurality of cycles.

After the selective etch and deposition (step 112) an optional post etch (step 124) may be provided. The optional post etch (step 124) may be used to further etch the etch layer and/or remove any remaining deposition on the mask and may also be used to remove any remaining mask. In some embodiments, the post etch (step 124) is used to remove all remaining deposition on the mask. In some embodiments, other processes may be used to remove remaining deposition on the mask. In addition, other processes may be used to remove both the remaining deposition on the mask and the mask. In some embodiments, other processes may be used to remove the mask. In some embodiments, a cyclical process may be used by returning to the selective etch of the etch layer and selective deposition on the mask (step 112) after the post etch (step 124).

Since some embodiments selectively deposit on the mask while selectively etching the etch layer, features may be etched deeper using a thinner mask. In addition, concentrations and/or ratios of the etch component and deposition component provide knobs that may be used to control different etch characteristics, such as dense feature versus isolation feature etch ratios, etch rates, bowing, etch front roughness, and etch selectivity. As a result, some embodiments are able to reduce bowing, reduce mask loss, and reduce isolation-dense loading. Since various embodiments do not rely on nucleation delay or self-assembled monolayers, which over time lose selectivity, the overall selectivity provided by some embodiments that provide concurrent deposition and etching is improved by avoiding unwanted deposition on the etch layer.

Example 1

Figure 2A:
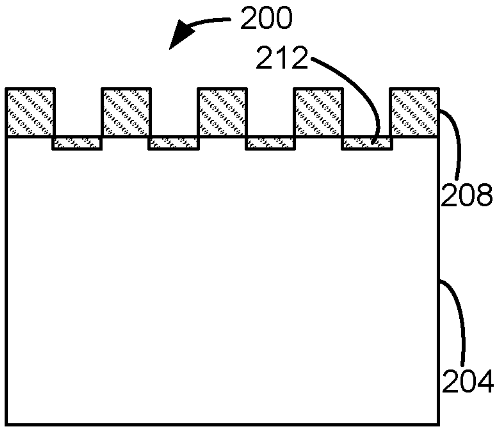
FIGS. 2A-D are schematic cross-sectional views of structures processed according to an embodiment.

In some embodiments, the providing the structure with an etch layer under a mask (step 104) provides a silicon etch layer under a silicon oxide mask. FIG. 2A is a schematic cross-sectional view of part of a structure 200 with an etch layer 204 and a mask 208. A native silicon oxide layer 212 is formed over a surface of the silicon etch layer 204.

In some embodiments, an optional pre-etch (step 108) is provided. In some embodiments, the pre-etch (step 108) etches the etch layer 204. In some embodiments, the pre-etch (step 108) etches the mask 208. In some embodiments with a silicon etch layer 204 and a native silicon oxide layer 212, a breakthrough step to remove the silicon oxide 212 is provided as part of the pre-etch (step 108). In some embodiments, the breakthrough step provides a $CF_4$ based plasma to remove the silicon oxide 212. In some embodiments, a breakthrough step would be needed if there is a native silicon oxide 212. In some embodiments where a previous etch has been performed and the structure has not been exposed to oxygen, so that a native oxide is not formed on a silicon etch layer 204, a breakthrough step would not be needed. In addition, in some embodiments, if the etch layer 204 is carbon, a breakthrough step might not be needed. In some embodiments, the pre-etch step (step 108) comprises providing an atomic layer etch. In some embodiments where the etch layer 204 is a silicon layer, the pre-etch step is an atomic layer etch comprising a modification phase of providing a chlorine plasma with no or a low bias or thermal chlorine ($Cl_2$) plasma in order to modify part of the etch layer 204 and a sputtering phase providing an argon (Ar) or helium (He) plasma with a bias to cause bombardment and sputtering of the modified part of the etch layer 204. In some embodiments, purges may be provided between the different phases.

Figure 2B:
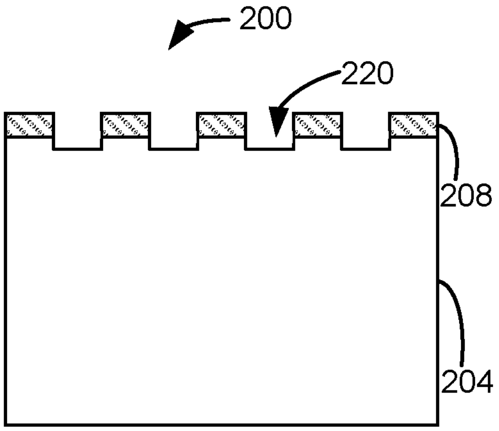

FIG. 2B is a schematic cross-sectional view of part of a structure 200 after the pre-etch. The native oxide layer has been etched away. In some embodiments, some of the etch layer 204 and some of the mask 208 may also be etched away forming etch features 220 in the etch layer 204. In some embodiments, part of the pre-etch step (step 108) is the breakthrough etch. In some embodiments, after the breakthrough etch, the pre-etch uses an atomic layer etch to further etch the etch layer 204.

After the optional pre-etch step (step 108), the selective etch of the etch layer and selective deposition on the mask are provided (step 112). In some embodiments, the selective deposition (step 116) and selective etch (step 120) are provided simultaneously. In some embodiments, the etch gas comprises boron trichoride ($BCl_3$), nitrogen ($N_2$), and hydrogen bromide (HBr). In some embodiments, the deposition component comprises a metalloid or metal containing precursor of boron in $BCl_3$. The etch component, comprises a halogen containing component. The halogen containing component comprises HBr and $BCl_3$. The etch gas is formed into a plasma. The plasma selectively deposits a boron nitride layer on the mask 208 and selectively etches the etch layer 204.

Figure 2C:
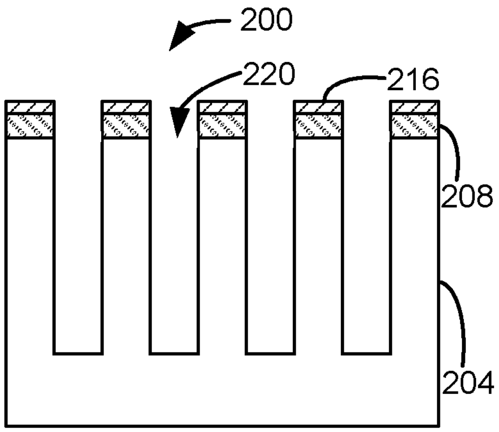

FIG. 2C is a schematic cross-sectional view of part of a structure 200 after the selective etch of the etch layer and selective deposition on the mask is provided (step 112). In some embodiments, a boron nitride (BN) deposition layer 216 is deposited over the mask 208 and the etch layer 204 is etched. In some embodiments with an etch gas of $BCl_3$, $N_2$, and $Cl_3$, the selective etch of the etch layer and selective deposition on the mask deposits a BN deposition layer 216 on the mask 208 and etches the etch layer 204. In other embodiments with an etch gas of $BCl_3$, $N_2$, and HBr, the selective etch of the etch layer and selective deposition on the mask deposits a BN deposition layer 216 on the mask 208 and etches the etch layer 204.

After the selective etch of the etch layer and selective deposition on the mask (step 112), the optional post etch (step 124) is provided. The post etch (step 124) may be used to etch one or more of the deposition layer 216, the etch layer 204, and the mask 208. In some embodiments, the selective etch of the etch layer and selective deposition on the mask (step 112) removes the deposition 216 on the mask 208, so that the post etch (step 124) only etches the mask 208. In some embodiments, the optional post etch (step 124) comprises providing an atomic layer etch. In some embodiments, the atomic layer etch comprises a modification phase of providing a chlorine plasma with no or a low bias or thermal plasma in order to modify part of the etch layer 204 and a sputtering phase providing an argon (Ar) or helium (He) plasma with a bias to cause bombardment and sputtering of the modified part of the etch layer 204.

Figure 2D:
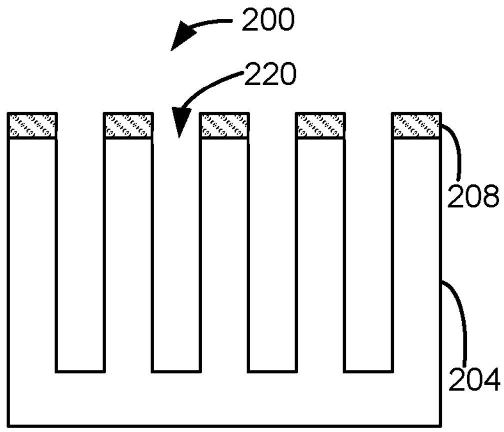

FIG. 2D is a schematic cross-sectional view of part of a structure 200 after the optional post etch (step 124) used in some embodiments. The BN deposition layer is at least partially etched. In some embodiments, the BN deposition layer is completely etched away.

In some embodiments, further etching may be desired. However, the deposition on the mask, such as the BN deposition layer has been removed. Therefore, in some embodiments the process provides another cycle of the selective etch of the etch layer and selective deposition on the mask (step 112) followed by the post etch (step 124). The cycle may be repeated until a desired etch depth is reached.

In some embodiments, the selective deposition (step 116) comprises a PECVD deposition of a nitride, such as BN, SiN, and WNx, and the selective etch (step 120) comprises an RIE of a silicon etch layer. In some embodiments, at least one of $BCl_3$, silicon tetrachloride ($SiCl_4$), and $WF_6$ may be used with $N_2$ to provide a BN, SiN, or WNx deposition and Br or Cl radicals to etch Si. For example, a plasma formed from $BCl_3$, $N_2$, and HBr may be used to provide a simultaneous selective deposition (step 116) and selective etch (step 120).

Figure 3A:
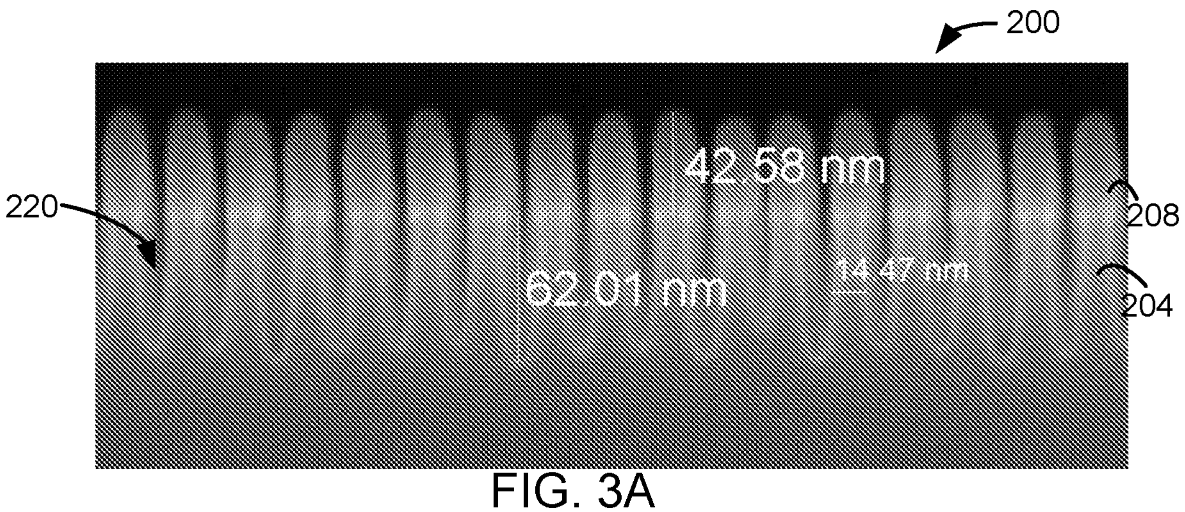
FIGS. 3A-B are photographs of a cross-sectional view of part of a structure processed according to an embodiment.

FIG. 3A is a photograph of a cross-sectional view of part of a structure 200 after features 220 have been etched into the etch layer 204 according to some embodiments. In some embodiments, the etch gas comprises $BCl_3$, $N_2$, and HBr. The ratios of the flow of the components of the etch gas may be optimized. In some embodiments, a flow of boron that is about the same as the flow of nitrogen, within the range ratio of boron to nitrogen of between 1:1 and 1:3. In some embodiments, the ratio of the flow of HBr to the flow of $BCl_3$ is about 1:1, so that there is enough etchant gas to provide a selective etch without etching too much. In some embodiments, a ratio of the molar flow of $BCl_3$ to $N_2$ to HBr is about 1:1:2. In some embodiments, an Ar or He diluent may be added to the etch gas. In FIG. 3A all of the etched features 220 are narrow and close together so that the features 220 are dense features.

Figure 3B:
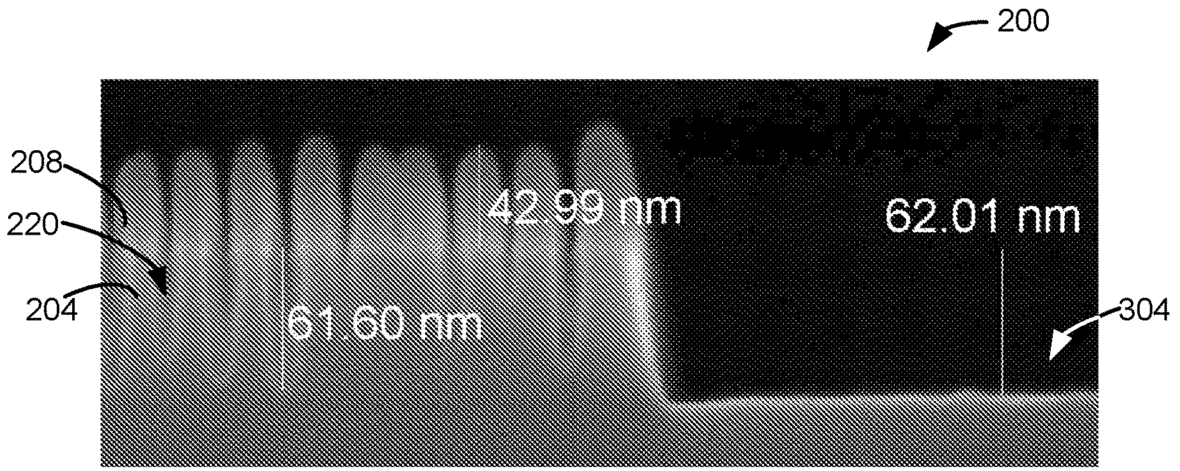

FIG. 3B is a photograph of a cross-sectional view of another part of the structure 200 that has been etched. In this part of the structure 200, some of the features 220 are narrow and therefore dense and another feature 304 is wide and therefore isolated. In FIG. 3A for the dense features 220, about 42.58 nm of the mask 208 remains, and the dense features 220 were etched about 62.01 nm. In FIG. 3B, about 42.99 nm of the mask 208 remains and the dense features were etched 61.60 nm and the isolated feature 304 was etched about 62.01 nm. In addition, the etch front of the isolated feature 304 was relatively flat. This shows that this embodiment is able to provide an etch that is able to etch both isolated and dense features at about an equal rate and also is able to provide a relatively flat etch front for wide features.

Example 2

Figure 4A:
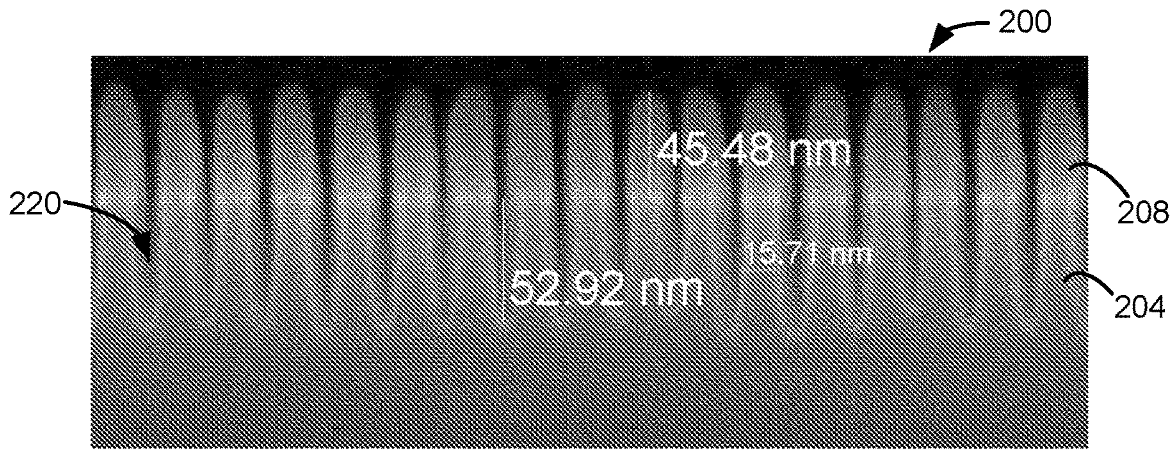
FIGS. 4A-B are photographs of a cross-sectional view of part of a structure processed according to another embodiment.
Figure 4B:
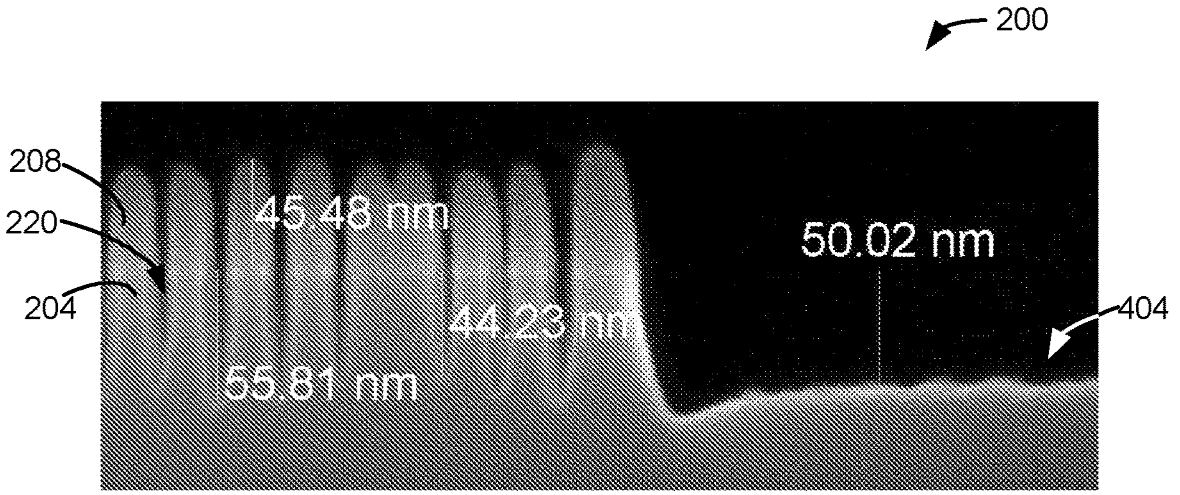

In some embodiments, starting with the same structure 200 and the same pre-etch (step 108) as in Example 1, a different etch gas recipe is provided. The etch gas has been optimized to have a ratio of the molar flow of $BCl_3$ to $N_2$ to HBr of about 1:1:1. FIG. 4A is a photograph of a cross-sectional view of part of a structure 200 after features 220 have been etched into the etch layer 204 according to some embodiments. In FIG. 4A all of the etched features 220 are narrow and close together so that the features 220 are dense features. FIG. 4B is a photograph of a cross-sectional view of another part of the structure 200 that has been etched according to some embodiments. In this part of the structure 200, some of the features 220 are narrow and therefore dense and another feature 404 is wide and therefore isolated. In FIG. 4A for the dense features 220, about 45.48 nm of the mask 408 remains, and the dense features 220 were etched about 52.92 nm. In FIG. 4B, about 45.48 nm of the mask 408 remains and the dense features were etched 55.81 nm and the isolated feature 404 was etched about 50.02 nm. In addition, the etch front of the isolated feature 404 was less flat than a previous embodiment. In some embodiments, there is more loading so that the dense features are etched more than the isolated features. In addition, the isolated features are not as flat as in the previous embodiment.

Example 3

Figure 5A:
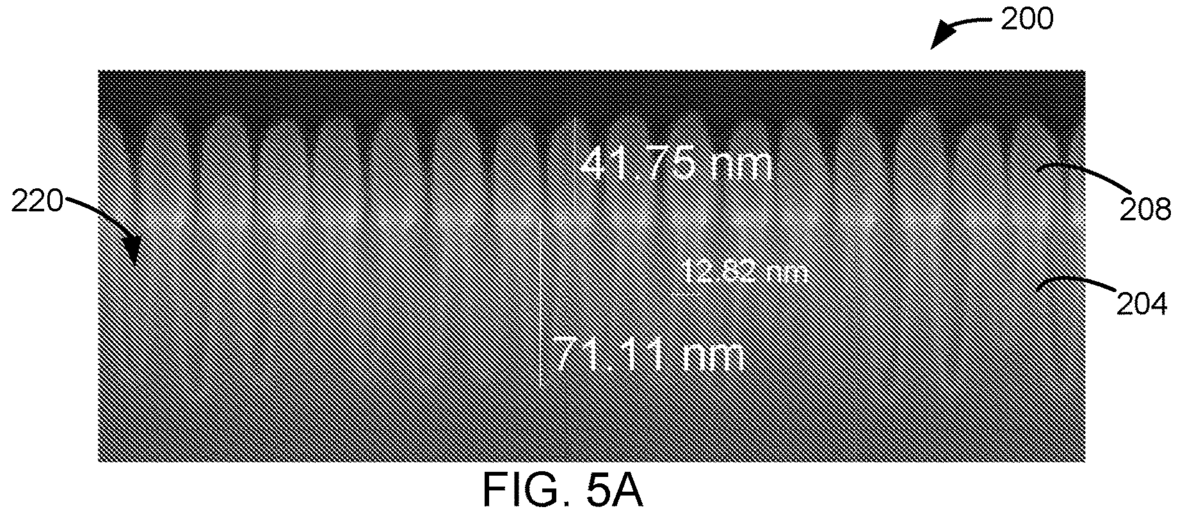
FIGS. 5A-B are photographs of a cross-sectional view of part of a structure processed according to another embodiment.
Figure 5B:
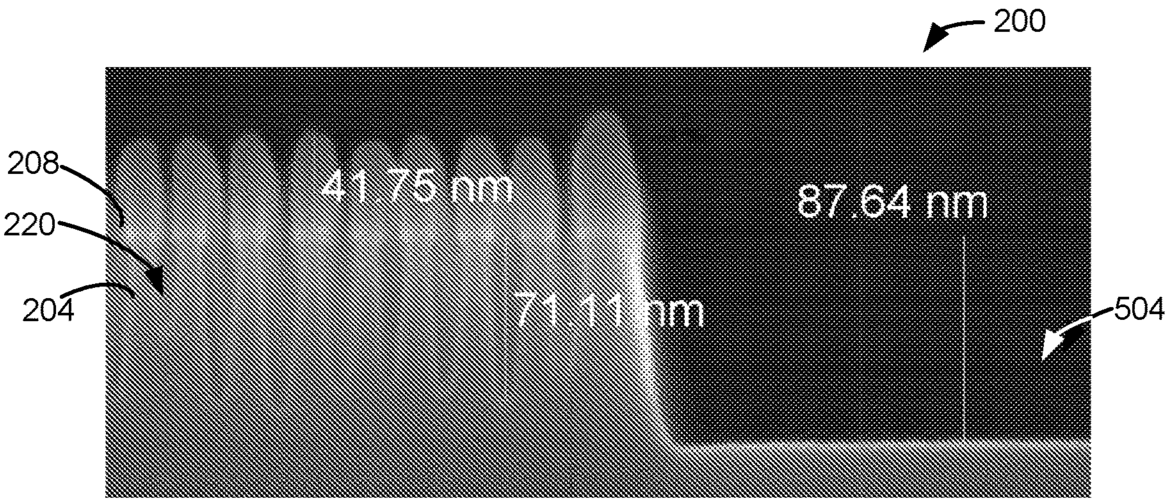

In some embodiments, starting with the same structure 200 and the same pre-etch (step 108) as in Example 1, a different etch gas recipe is provided. The etch gas has been optimized to have a ratio of the molar flow of $BCl_3$ to $N_2$ to HBr of about 1:1:4. FIG. 5A is a photograph of a cross-sectional view of part of a structure 200 after features 220 have been etched into the etch layer 204 according to some embodiments. In FIG. 5A all of the etched features 220 are narrow and close together so that the features 220 are dense features. FIG. 5B is a photograph of a cross-sectional view of another part of the structure 200 that has been etched according to some embodiments. In this part of the structure 200, some of the features 220 are narrow and therefore dense and another feature 504 is wide and therefore isolated. In FIG. 5A for the dense features 220, about 41.75 nm of the mask 408 remains, and the dense features 220 were etched about 71.11 nm. In FIG. 5B, about 41.75 nm of the mask 408 remains and the dense features were etched 71.11 nm and the isolated feature 404 was etched about 87.64 nm. In addition, the etch front of the isolated feature 504 is flat. In some embodiments, isolated features are etched more than dense features.

The above examples show how the different ratios of gases may be used to tune etch rates between isolated and dense features. In addition, such ratios may be used to further tune bowing and the amount of deposition on the mask. In some embodiments, the flow rate of the gas component depositing on the mask may also be tuned to be deposited as sidewall passivation to prevent bowing. By tuning the amount of deposition on the mask, the amount of bowing may be tuned.

In some embodiments, the selective deposition (step 116) comprises a PECVD deposition of a carbide, such as boron carbide ($B_4C$), silicon carbide (SiC), and tungsten carbide ($WC_X$), and the selective etch (step 120) comprises an RIE of a silicon etch layer. In some embodiments, at least one of $BCl_3$, $SiCl_4$, and $WF_6$ may be used with $CH_4$ and $Cl_2$ to provide a $B_4C$, SiC, or $WC_X$ deposition and Br or Cl radicals to etch Si. For example, a plasma formed from $SiCl_4$, $CH_4$, and Cl: may be used to provide the simultaneous selective deposition (step 116) and selective etch (step 120).

In some embodiments, the selective deposition (step 116) comprises a PECALD deposition of a fluoride and the selective etch (step 120) comprises an RIE of a silicon etch layer. In some embodiments, thermal trimethylaluminum ($Al(CH_3)_3$ or TMA) may be used in a plasma formed by at least one of $NF_3$, $CF_4$, and sulfur hexafluoride ($SF_6$). Aluminum trifluoride is deposited on the mask in an ALD process. Fluorine radicals are used to etch Si.

In some embodiments, the selective deposition (step 116) comprises a PEALD deposition of an oxide, such as boron oxide ($B_2O_3$, $B_2O$, and/or $B_6O$), $SiO_2$, tungsten oxide ($W_2O_3$, $WO_2$, and/or $WO_3$), titanium oxide (TiO, $TiO_2$, and/or $Ti_2O_3$) and tin oxide (SnO and/or $SnO_2$) on a mask of at least one of SiN, $SiO_2$, or metal containing PR, and the selective etch (step 120) comprises an RIE of a carbon etch layer. In some embodiments, a plasma may be formed from $WF_6$ and at least one of $O_2$ and $CH_4$ or $CO_2$ and $CH_4$ to provide a deposition on the mask and oxygen radicals for etching carbon.

In some embodiments, the selective deposition (step 116) comprises a PECALD deposition of a fluoride and the selective etch (step 120) comprises an RIE of a carbon etch layer. In some embodiments, thermal TMA may be used in a plasma formed by $CH_2F_2$ and $O_2$. Aluminum trifluoride ($AlF_3$) is deposited on the mask in an ALD process. Oxygen radicals or ions are used to etch the carbon etch layer.

In some embodiments, the etch gas comprises $BCl_3$, $N_2$, hydrogen ($H_2$), and chlorine ($Cl_2$). In some embodiments, inert diluents, such as noble gases, may be added to the etch gas. In some embodiments, an inert gas of He or Ar may be added to the etch gas. In some embodiments, $Cl_2$ provides halogen. In some embodiments, the etch gas comprises $BCl_3$, $N_2$, and hydrogen chloride (HCl). In some embodiments, a metalloid containing deposition, such as BN, boron oxide, boron carbide, SiN, $SiO_2$, and SiC is deposited instead of a metal containing deposition. Such embodiments are free of metal containing contaminants. Such metal free processes may be required during certain semiconductor processes, such as some front end of line processes. In other embodiments, aluminum contaminants are acceptable, so that a deposition of an aluminum compound such as $AlF_3$, aluminum oxide ($Al_2O_3$), and aluminum nitride (AlN) may be deposited over the mask. In other embodiments, at least one of tungsten hexafluoride ($WF_6$), tin tetrachloride ($SnCl_4$), and titanium tetrachloride ($TiCl_4$) is a metal containing precursor used to deposit a metal containing deposition containing at least one of W, Sn, Ti over the mask. In various embodiments, the metalloid or metal containing precursor is a precursor containing at least one of boron, silicon, carbon, nitrogen, aluminum, fluorine, chlorine, tungsten, molybdenum, titanium, tin, tantalum, hafnium, zirconium, hydrogen, and oxygen. In various embodiments, the precursor may be one or more of $BCl_3$, trimethylborane ($B(CH_3)3$), triethylborane ($B(C_2H_5)_3$), silicon tetrachloride ($SiCl_4$), silane ($SiH_4$), trimethylaluminum ($Al(CH_3)_3$), dimethylaluminum chloride ($(CH_3)_2AlCl$), tungsten hexafluoride ($WF_6$), tungsten pentachloride ($WCl_5$), molybdenum hexafluoride ($MoF_6$), molybdenum pentachloride ($MoCl_5$), titanium tetrachloride ($TiCl_4$), titanium tetrafluoride ($TiF_4$), tin tetrachloride ($SnCl_4$), tetramethyltin ($Sn(CH_3)_4$), tantalum pentachloride ($TaCl_5$), tantalum pentafluoride ($TaF_5$), hafnium tetrachloride ($HfCl_4$), tetrakis (dimethylamido (hafnium) ($Hf[N(CH_3)_2]_4$), zirconium tetrachloride ($ZrCl_4$), and tetrakis (dimethylamido (zirconium) ($Zr[N(CH_3)_2]_4$).

Some embodiments allow for the selective deposition of a metalloid containing mask on SiN, SiO, or photoresist with respect to doped or undoped material of at least one of silicon, silicon germanium, carbon, and germanium, while simultaneously etching the doped or undoped material of at least one of silicon, silicon germanium, carbon, and germanium. Such embodiments may be hydrofluorocarbon and fluorocarbon free. Some embodiments have carbon free depositions. Various embodiments are able to selectively deposit on the mask with respect to the etch layer while simultaneously etching the etch layer. In some embodiments, the selective deposition is governed by more than just topology, but instead selectively deposits according to the difference in chemistry between the mask and the etch layer. Various embodiments provide an etch gas that comprises a halogen containing gas in addition to a gas containing the metal or metalloid containing precursor, where the etch gas is hydrofluorocarbon and fluorocarbon free. Some embodiments allow for selective deposition on photoresist with respect to carbon, while simultaneously etching a carbon etch layer.

By simultaneously depositing on the mask 208 and etching the etch layer 204, the etch may have a higher throughput. In addition, using a separate deposition step and a separate etch step has been found to result in a lower quality etch. The lower quality results in features with different etch depths. Also, having separate deposition and etch steps results in etching isolated features to different depths than the depths of dense features. In addition, the bottoms of isolated features are rough, instead of being flat. Processes that do not simultaneously deposit and etch rely on deposition selectivity alone. Over time, there will be some deposition on the etch layer, causing deposition selectivity to be lost. By depositing and etching simultaneously, deposition selectivity may be maintained for longer periods of time. Some embodiments using a simultaneous deposition and etch provide a higher quality deposition and etch. In some embodiments, features with a width of less than 15 nm and a depth to width aspect ratio of at least 6:1 may be provided. In some embodiments, for etching a carbon layer with a photoresist mask the features have a width of less than 15 nm with a height to width aspect ratio of less than 3:1. For example, the aspect ratio is in the range of about 1:1 to 2:1. Some embodiments allow features to be selectively etched in the etch layer while the structure is maintained at a temperature of less than 400° C. In some embodiments, the structure is maintained at a temperature of less than 300° C. For example, the structure is maintained at a temperature of less than 150° C. Maintaining the structure below 300° C. reduces thermal effects or thermal damage to the structure. In some embodiments where the etch layer is silicon, at least 60 nm of the etch layer 204 is etched. In some embodiments, at least 100 nm of the etch layer 204 is etched. Some embodiments allow a high height to depth aspect ratio allowing for deeper etch depths.

Figure 6:
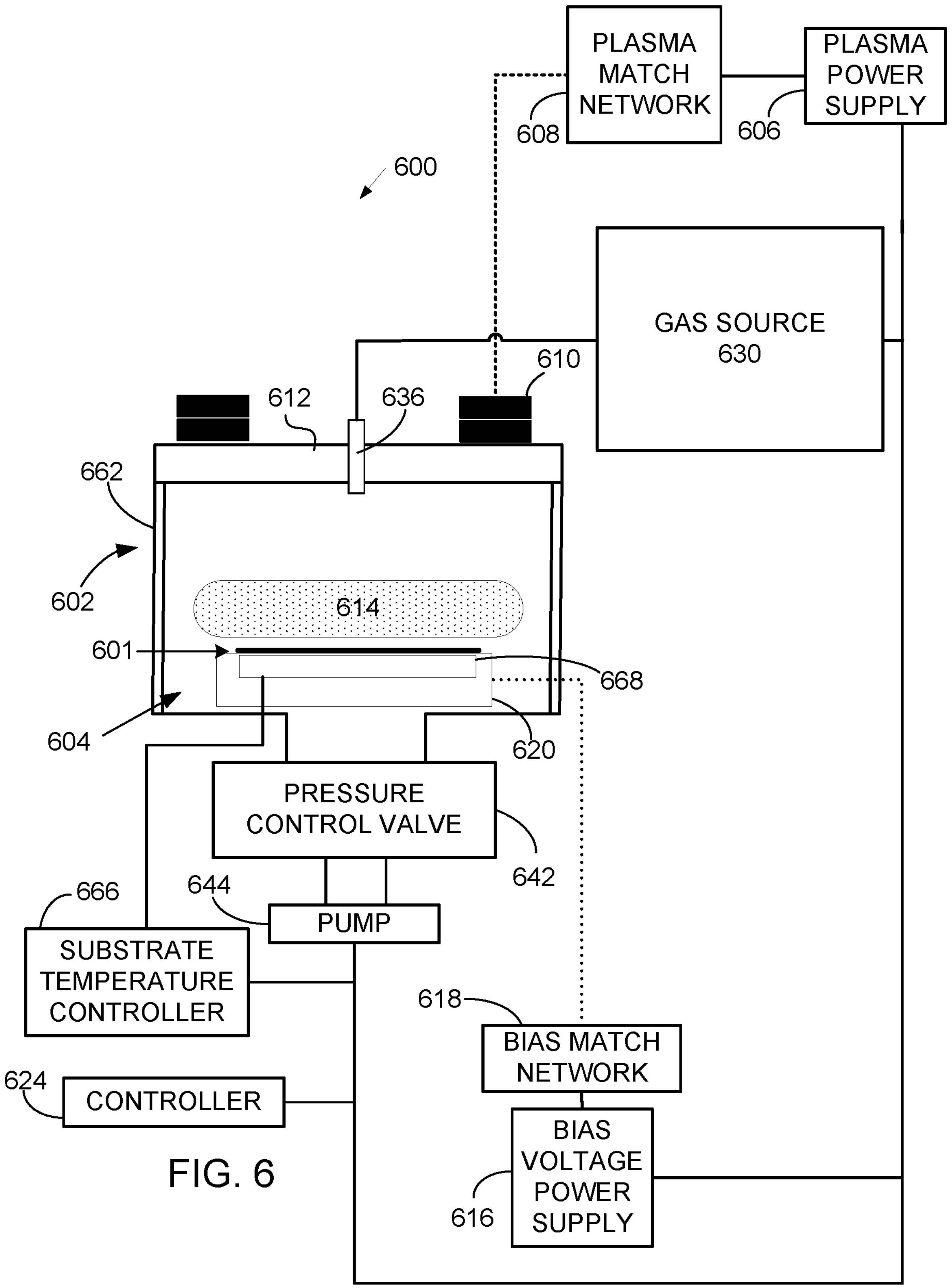
FIG. 6 is a schematic view of a etch chamber that may be used in an embodiment.

In an example, FIG. 6 schematically illustrates an example of a plasma processing system 600 that may be used in some embodiments. The plasma processing system 600 may be used to process a substrate 601 in accordance with some embodiments. The plasma processing system 600 includes a plasma reactor 602 having a plasma processing chamber 604, enclosed by a chamber wall 662. A plasma power supply 606, tuned by a plasma match network 608, supplies power to a transformer coupled plasma (TCP) coil 610 located near a power window 612 to create a plasma 614 in the plasma processing chamber 604 by providing an inductively coupled power. The TCP coil (upper power source) 610 may be configured to produce a uniform diffusion profile within the plasma processing chamber 604. For example, the TCP coil 610 may be configured to generate a toroidal power distribution in the plasma 614. The power window 612 is provided to separate the TCP coil 610 from the plasma processing chamber 604 while allowing energy to pass from the TCP coil 610 to the plasma processing chamber 604. A wafer bias voltage power supply 616 tuned by a bias match network 618 provides power to an electrode 620 to set the bias voltage on the substrate 601. The electrode 620 provides a chuck for the substrate 601, where the electrode 620 acts as an electrostatic chuck and substrate support. A substrate temperature controller 666 is controllably connected to a Peltier heater/cooler 668. A controller 624 controls the plasma power supply 606, the substrate temperature controller 666, and the wafer bias voltage power supply 616.

The plasma power supply 606 and the wafer bias voltage power supply 616 may be configured to operate at specific radio frequencies such as 13.56 megahertz (MHz), 60 MHz, 27 MHz, 2 MHz, 1 MHz, 400 kilohertz (kHz), or combinations thereof. Plasma power supply 606 and wafer bias voltage power supply 616 may be appropriately sized to supply a range of powers in order to achieve desired process performance. For example, in one embodiment, the plasma power supply 606 may supply the power in a range of 50 to 5000 Watts, and the wafer bias voltage power supply 616 may supply a bias voltage in a range of 20 to 2000 Volt. In addition, the TCP coil 610 and/or the electrode 620 may be comprised of two or more sub-coils or sub-electrodes. The two or more sub-coils or sub-electrodes may be powered by a single power supply or powered by multiple power supplies.

As shown in FIG. 6, the plasma processing system 600 further includes a gas source 630. The gas source 630 provides gas or remote plasma to a feed 636 in the form of a nozzle. The process gases and byproducts are removed from the plasma processing chamber 604 via a pressure control valve 642 and a pump 644. The pressure control valve 642 and the pump 644 also serve to maintain a particular pressure within the plasma processing chamber 604. The gas source 630 is controlled by the controller 624. A Kiyo® by Lam Research Corp. of Fremont, CA, may be used to practice an embodiment. This embodiment is an inductively coupled plasma system. In other embodiments, a capacitively coupled plasma system may be used.

Figure 7:
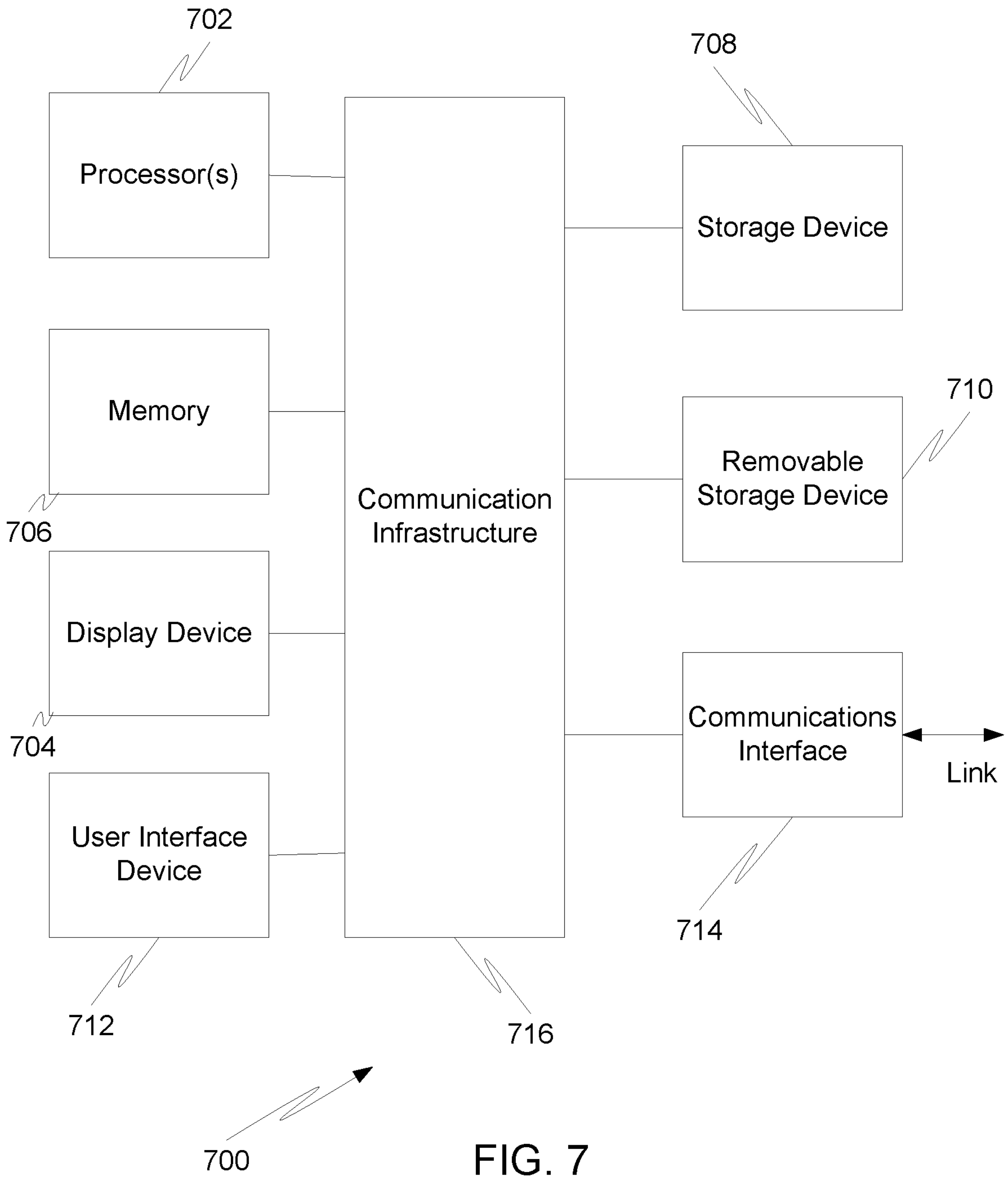
FIG. 7 is a schematic view of a computer system that may be used in practicing an embodiment.

To provide an example of a controller 624 in an embodiment, FIG. 7 is a high level block diagram showing a computer system 700 that is suitable for implementing a controller 624 used in embodiments. The computer system may have many physical forms ranging from an integrated circuit, a printed circuit board, and a small handheld device, up to a huge supercomputer. The computer system 700 includes one or more processors 702, and further can include an electronic display device 704 (for displaying graphics, text, and other data), a main memory 706 (e.g., random access memory (RAM)), storage device 708 (e.g., hard disk drive), removable storage device 710 (e.g., optical disk drive), user interface devices 712 (e.g., keyboards, touch screens, keypads, mice or other pointing devices, etc.), and a communication interface 714 (e.g., wireless network interface). The communication interface 714 allows software and data to be transferred between the computer system 700 and external devices via a link. The system may also include a communications infrastructure 716 (e.g., a communications bus, cross-over bar, or network) connected to the aforementioned devices/modules.

Information transferred via communications interface 714 may be in the form of signals such as electronic, electromagnetic, optical, or other signals capable of being received by communications interface 714, via a communication link that carries signals and may be implemented using wire or cable, fiber optics, a phone line, a cellular phone link, a radio frequency link, and/or other communication channels. With such a communications interface, it is contemplated that the one or more processors 702 might receive information from a network or might output information to the network in the course of performing the above-described method steps. Furthermore, method embodiments may execute solely upon the processors or may execute over a network, such as the Internet, in conjunction with remote processors that share a portion of the processing.

The term “non-transient computer readable medium” is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

Some embodiments allow features to be selectively etched in the etch layer while the electrode 620 acting as a substrate support is maintained at a temperature of less than 400° C. In some embodiments, the substrate support is maintained at a temperature between 0° C. and 400° C. In some embodiments, the electrode 620 acting as a substrate support is maintained at a temperature of less than 300° C. For example, the electrode 620 acting as a substrate support is maintained at a temperature of less than 150° C. Maintaining the electrode 620 acting as a substrate support below 300° C. reduces thermal effects or thermal damage to the structure.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure. As used herein, the phrase "A, B, or C" should be construed to mean a logical ("A OR B OR C"), using a non-exclusive logical "OR," and should not be construed to mean 'only one of A or B or C. Each step within a process may be an optional step and is not required. Different embodiments may have one or more steps removed or may provide steps in a different order. In addition, various embodiments may provide different steps simultaneously instead of sequentially.

What is claimed is:

1. A method for selectively etching at least one feature in an etch layer of doped or undoped material of at least one of silicon, silicon germanium, carbon, and germanium with respect to a mask, comprising:

simultaneously selectively etching at least one feature in the etch layer with respect to the mask and selectively depositing a deposition layer, comprising:

providing an etch gas comprising a boron containing precursor and a halogen or oxygen containing component;

forming the etch gas into a plasma; and exposing the etch layer to the plasma to simultaneously selectively etching at least one feature in the etch layer with respect to the mask and selectively depositing a deposition layer of a boron containing material over the mask with respect to the etch layer.

2. The method, as recited in claim 1, wherein the mask comprises at least one of silicon oxide or silicon nitride and wherein the etch layer comprises of at least one of silicon, silicon germanium, and germanium.

3. The method, as recited in claim 2, further comprising a breakthrough etch for etching a native oxide layer on the etch layer.

4. The method, as recited in claim 1, wherein the halogen containing component comprises $BCl_3$.

5. The method, as recited in claim 1, further comprising providing a pre-etch, wherein the pre-etch selectively and partially etches the etch layer with respect to the mask before simultaneously selectively etching at least one feature in the etch layer with respect to the mask and selectively depositing a deposition layer.

6. The method, as recited in claim 1, further comprising providing an atomic layer etch of the at least one feature in the etch layer after simultaneously selectively etching at least one feature in the etch layer with respect to the mask and selectively depositing a deposition layer.

7. The method, as recited in claim 1, further comprising removing the deposition layer.

8. The method, as recited in claim 1, further comprising providing a substrate support temperature of no more than 300° C.

9. The method, as recited in claim 1, wherein the simultaneously selectively etching at least one feature in the etch layer with respect to the mask and selectively depositing a deposition layer, comprises a selective deposition using at least one of PECVD, PEALD, and ALD and a selective etch using at least one of RIE and ALE.

10. The method, as recited in claim 1, wherein the mask comprises a metal containing photoresist and wherein the etch layer comprises carbon.

11. The method, as recited in claim 1, wherein the deposition layer is at least one of an oxide, nitride, and carbide of a boron.

12. The method, as recited in claim 1, wherein the etch layer comprises of at least one of silicon, silicon germanium, and germanium and wherein the etch gas comprises an etch component comprising a halogen and a deposition component comprising at least one of an oxygen, carbon, or nitrogen containing component and the boron containing precursor.

13. The method, as recited in claim 1, wherein the etch layer is carbon and wherein the mask is a metal containing photoresist mask, and wherein the etch gas comprises an etch component comprising oxygen and a deposition component comprising at least one of an oxygen, carbon, or nitrogen containing component and the boron containing precursor.

* * * * *